United States Patent
Jahelka et al.

(10) Patent No.: US 7,626,799 B2
(45) Date of Patent: Dec. 1, 2009

(54) MICROELECTRONIC DEVICE EQUIPPED WITH A THERMAL PROTECTION CIRCUIT AND THERMAL PROTECTION METHOD FOR A MICROELECTRONIC DEVICE

(75) Inventors: Tomas Jahelka, Prague (CZ); Jaromir Schindler, Hranice (CZ)

(73) Assignee: STMicroelectronics Design and Application S.r.o., Prague (CZ)

( * ) Notice: Subject to any disclaimer, the term of this patent is extended or adjusted under 35 U.S.C. 154(b) by 117 days.

(21) Appl. No.: 11/832,774

(22) Filed: Aug. 2, 2007

(65) Prior Publication Data
US 2008/0030914 A1    Feb. 7, 2008

(30) Foreign Application Priority Data
Aug. 4, 2006    (EP) ................... 06118479

(51) Int. Cl.
*H02H 9/08*    (2006.01)
(52) U.S. Cl. ........................ 361/103; 361/93.8
(58) Field of Classification Search ....... 361/93.7–93.9, 361/103, 104
See application file for complete search history.

(56) References Cited

U.S. PATENT DOCUMENTS

| | | | |
|---|---|---|---|
| 4,667,265 A | 5/1987 | Stanojevic et al. | |
| 5,070,322 A | 12/1991 | Fujihira | |
| 5,355,123 A * | 10/1994 | Nishiura et al. | 340/653 |
| 5,424,443 A | 6/1995 | Ganzer et al. | |
| 5,434,443 A | 7/1995 | Kelly et al. | |
| 5,905,617 A * | 5/1999 | Kawasoe | 361/86 |
| 6,320,275 B1 * | 11/2001 | Okamoto et al. | 307/10.1 |

FOREIGN PATENT DOCUMENTS

| | | |
|---|---|---|
| EP | 0 488 088 A1 | 6/1992 |
| EP | 0488088 A1 | 6/1992 |
| EP | 0 936 454 A2 | 8/1999 |
| EP | 0936454 A2 | 8/1999 |
| JP | 2001045655 A * | 2/2001 |

OTHER PUBLICATIONS

European Search Report from European Patent Application 06118479, filed Aug. 4, 2006.
European Search Report completed on Oct. 22, 2008 from corresponding European Application No. 06118479.

* cited by examiner

*Primary Examiner*—Danny Nguyen
(74) *Attorney, Agent, or Firm*—Lisa K. Jorgenson; William R. McClellan; Wolf, Greenfield & Sacks, P.C.

(57) ABSTRACT

A microelectronic device includes a first circuit and a second circuit, coupled to the first circuit for selectively preventing operation of the first circuit when a device temperature is higher than a temperature threshold. The second circuit is provided with a temperature responsive element, thermally coupled to the first circuit for providing a shutdown signal correlated to the device temperature. The temperature responsive element includes a reverse-biased junction element and the shutdown signal is correlated to a reverse leakage current of the reverse-biased junction element.

19 Claims, 5 Drawing Sheets

MICROELECTRONIC DEVICE EQUIPPED WITH A THERMAL PROTECTION CIRCUIT AND THERMAL PROTECTION METHOD FOR A MICROELECTRONIC DEVICE

BACKGROUND OF THE INVENTION

1. Field of the Invention

The present invention relates to a microelectronic device equipped with a thermal protection circuit and to a thermal protection method for a microelectronic device.

2. Discussion of the Related Art

As is known, several microelectronic circuits and devices require thermal protection in order to prevent damage caused by overheating. For example, thermal protection circuits are normally integrated in power amplifiers and voltage sources or regulators, because operation of power components may easily cause dangerous self-heating.

According to a widely used solution, the power component causing overheating is switched on and off, based on the response of a temperature sensing element, that is preferably integrated in the same die as the power component. The temperature sensing element normally comprises a forward-biased junction component, the on-state current whereof depends on temperature.

For the sake of clarity, reference will be made to FIG. 1, that shows a power MOS transistor 1 driven by an amplifier 2 and provided with a thermal protection circuit 3.

The thermal protection circuit 3 comprises a temperature sensing element, here a PN-junction diode 5, a current source 6, for supplying the temperature sensing element 5 with a sense current $I_S$, a first protection transistor 7, supplied by a further current source 8, a threshold circuit 9 and a second protection transistor 10.

The diode 5 is forward biased and a sense voltage $V_S$ on its anode 5a is nearly linearly dependent on temperature (approximately –2 mV/K). The first protection transistor 7 has its gate and drain terminals respectively connected to the anode 5a of the diode 5 and to an input of the threshold circuit 9, that is herein an inverter and has a switch threshold. The second protection transistor 10, here of the PMOS type, has its source and drain terminals respectively connected to a voltage supply line 11 and to a gate terminal of the power transistor 1, and is coupled to the threshold circuit 9 for receiving a control signal $V_C$ on its gate terminal.

In normal operation, the sense voltage $V_S$ on the anode 5a of the diode 5 is high so as to keep the first protection transistor 7 in the on-state. As long as the voltage on the input of the threshold circuit 9 is below the switch threshold, the control signal $V_C$ has an enable value (high in the example) for keeping the second protection transistor 10 in the off-state and enabling operation of the power transistor 1. As temperature increases, the sense voltage $V_S$ decreases until the first protection circuit 7 is turned off. The voltage on the input of the threshold circuit 9 then jumps above the switch threshold and causes the control voltage $V_S$ to switch to a shutdown value (low), for turning the second protection transistor 10 on. The power transistor 1 is thus cut off, because its gate terminal is stuck at a supply voltage $V_{CC}$ provided by the voltage supply line 11. Accordingly, acceptable temperature conditions may be restored and overheating is prevented.

Known thermal protection circuits, however, suffer from some drawbacks. In the first place, quite large additional currents are required, because the thermal sensing elements are based on forward-biased junction elements. The total quiescent current of the integrated device is therefore significantly increased, which is always undesirable and is especially disadvantageous in battery-operated apparatus. Solutions for reducing current consumption are sometimes available, but they normally require additional components, such as resistors or bipolar transistors. Therefore, the die area necessary to accommodate thermal protection circuits is increased, in spite of the fact that current reduction is only partially achieved and may not be satisfactory.

SUMMARY OF THE INVENTION

One object of the invention is to provide a microelectronic device and a thermal protection method for a microelectronic device that are free from the above described drawbacks.

According to one embodiment, a microelectronic device is provided, comprising a first circuit; and a second circuit, coupled to the first circuit for selectively preventing operation of the first circuit in response to a device temperature rising above a shutdown threshold, wherein the second circuit includes a temperature responsive element, thermally coupled to the first circuit for providing a shutdown signal correlated to the device temperature; wherein the temperature responsive element comprises a reverse-biased junction element and the shutdown signal is correlated to a reverse leakage current of the reverse-biased junction element.

According to another embodiment, thermal protection method for a microelectronic device comprises sensing a temperature of a circuit; and providing a shutdown signal correlated to the temperature, for selectively preventing operation of the circuit in response to the temperature rising above a shutdown threshold; wherein the step of sensing comprises reverse biasing a junction element and the step of providing comprises generating the shutdown signal based on a reverse leakage current of the junction element.

BRIEF DESCRIPTION OF THE DRAWINGS

For the understanding of the present invention, preferred embodiments thereof are now described, purely as non-limitative examples, with reference to the enclosed drawings, wherein.

DETAILED DESCRIPTION

Figure 1:
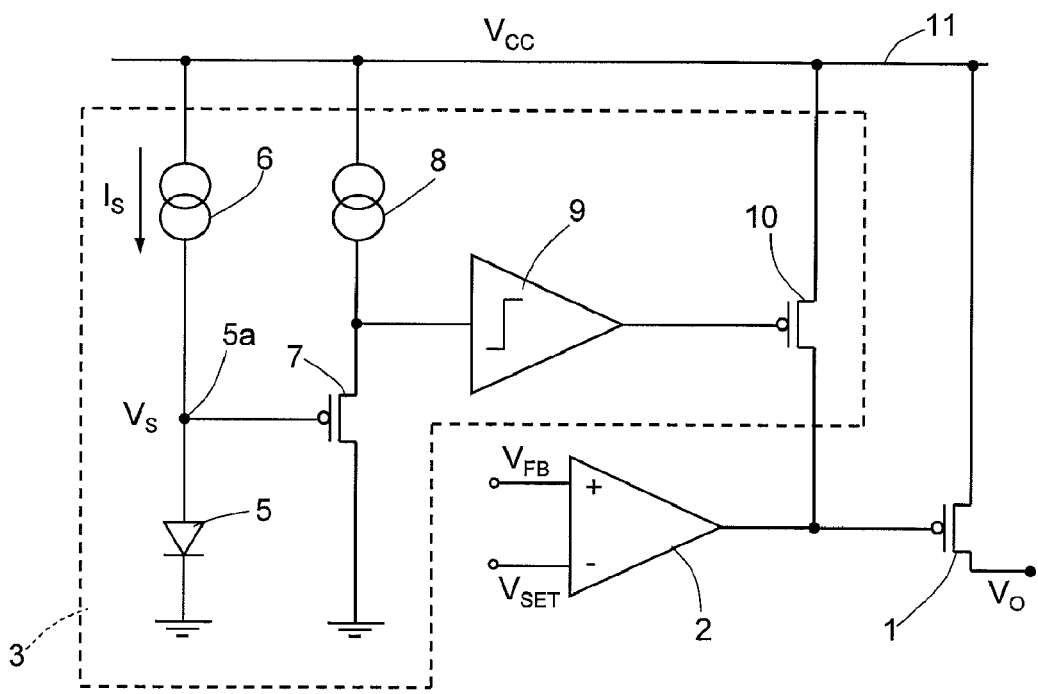
FIG. 1 is a simplified electrical diagram of a power device integrating a known thermal protection circuit.
Figure 2:
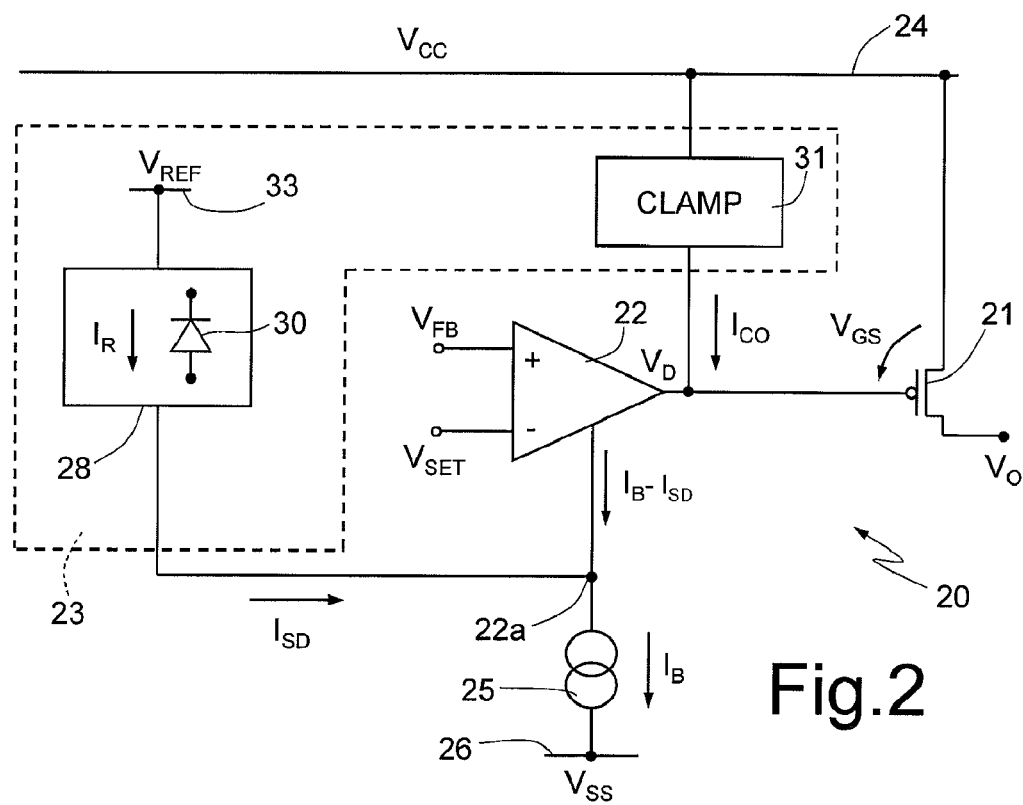
FIG. 2 is a simplified electrical diagram of a microelectronic device according to a first embodiment of the present invention.

As shown in FIG. 2, an integrated device 20 comprises a power transistor 21, an operational amplifier 22 and a thermal protection circuit 23.

The power transistor 21 and the operational amplifier 22 are coupled to form a voltage regulator, that is in itself known and is not described in detail herein.

A gate terminal of the power transistor 21, here a PMOS power transistor, is coupled to an output of the operational amplifier 22 for receiving a driving voltage $V_D$ under normal operation conditions. A source terminal of the power transistor 21 is connected to a positive voltage supply line 24, that provides a positive supply voltage $V_{CC}$. An output 20a of the integrated device 20 is formed by a drain terminal of the power transistor 21 and supplies an output voltage $V_O$.

The operational amplifier 22 is configured for providing the driving voltage $V_D$ in a known way, based on a set voltage $V_{SET}$ and a feedback voltage $V_{FB}$ supplied on its inputs (reference and feedback circuits are conventional and not shown in FIG. 2). In addition, a bias terminal 22a of the operational amplifier 22 is connected to a bias current source 25, that draws a bias current $I_B$.

The bias current $I_B$ is sunk by a negative voltage supply line 26, that provides a negative supply voltage $V_{SS}$.

The thermal protection circuit 23 comprises a temperature responsive element 28, based on a reverse-biased junction element 30 and thermally coupled to the power transistor 21, and a leaking clamp circuit 31.

Figure 3:
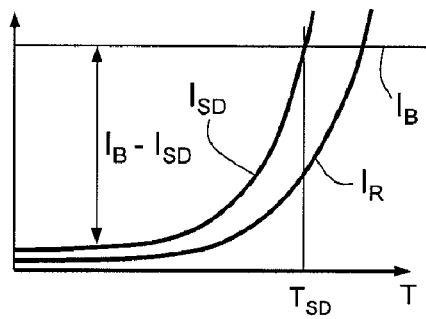
FIG. 3 is a graph showing quantities present in the device of FIG. 2.

The temperature responsive element 28 is connected to a voltage source 33, that provides a constant reference voltage $V_{REF}$, and to the bias terminal 22a of the operational amplifier 22, for supplying a shutdown current $I_{SD}$. The shutdown current $I_{SD}$ is generated by linearly amplifying a reverse leakage current $I_R$ of the junction element 30, that exponentially depends on a device temperature T (see FIG. 3).

First and second terminals of the leaking clamp circuit 31 are connected to the positive voltage supply line 24 and to the gate terminal of the power transistor 21, respectively. Moreover, the leaking clamp circuit 31 is configured for limiting a gate-source voltage $V_{GS}$ of the power transistor 21 below a safety level, in normal operation; and for providing a cutoff leakage current $I_{CO}$ during thermal shutdown, so that the power transistor 21 is maintained in the off-state.

Under normal operating condition, the reverse leakage current $I_R$ and the shutdown current $I_{SD}$ are negligible and the bias current $I_B$ only flows through the operational amplifier 22, that is correctly biased and is enabled to drive the power transistor 21.

As the device temperature T rises, the reverse leakage current $I_R$ and the shutdown current $I_{SD}$ exponentially grow, so that an increasing fraction of the bias current $I_B$ is prevented from flowing through the operational amplifier 22. When the shutdown current $I_{SD}$ equals the bias current $I_B$, the operational amplifier 22 is turned off and the integrated circuit 20 enters thermal shutdown condition. In the absence of the driving voltage $V_D$ from the operational amplifier 22, the cutoff leakage current $I_{CO}$ flowing through the leaking clamp circuit 31 causes a voltage drop that is smaller than a threshold voltage of the power transistor 21. Therefore, the power transistor 21 is maintained off and further undesired heating is prevented.

Figure 4:
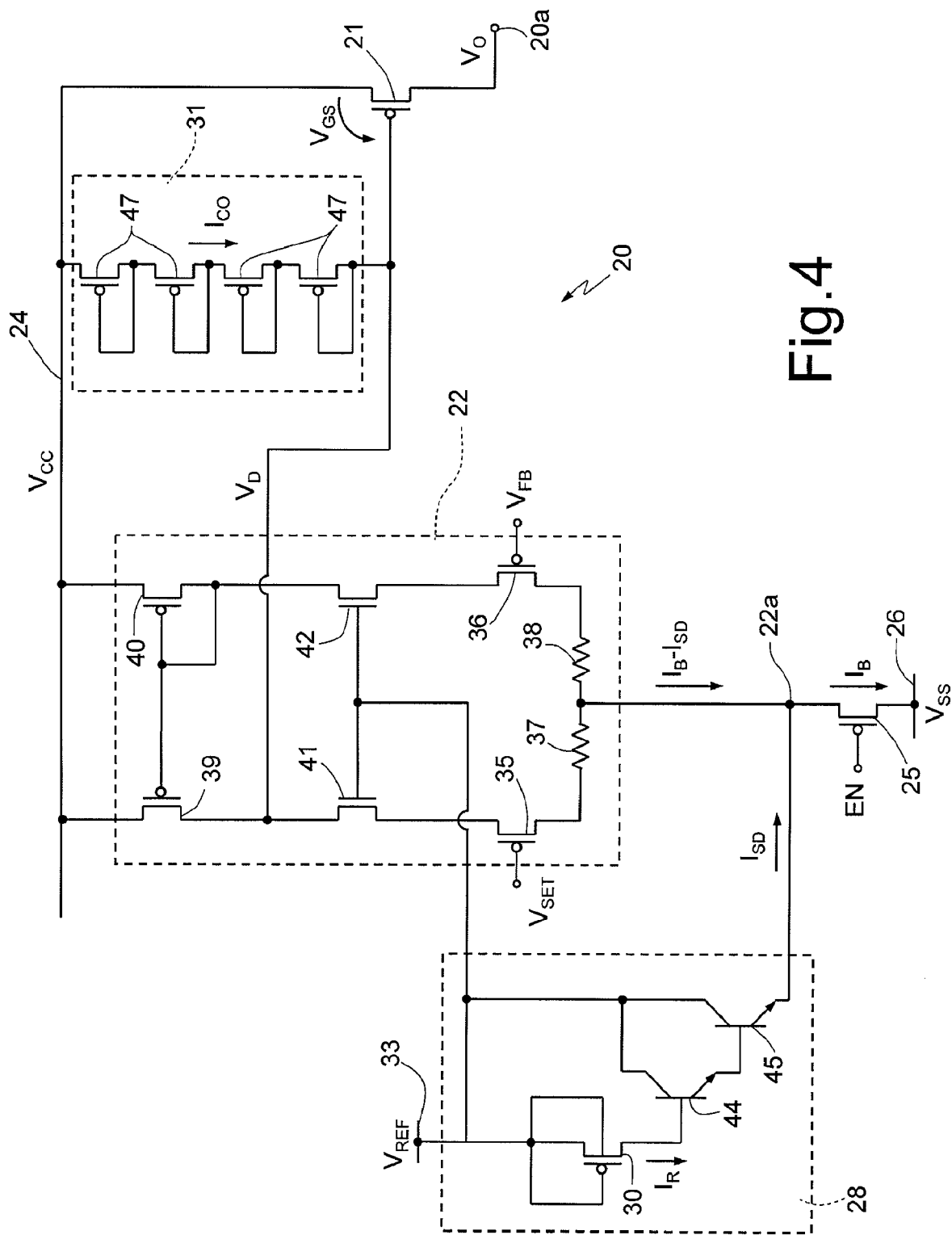
FIG. 4 is a more detailed electrical diagram of the device of FIG. 2.

The integrated circuit 20 is illustrated in greater detail in FIG. 4.

The operational amplifier 22 comprises first and second input transistors 35, 36, of PMOS type, coupled to form a differential pair and provided with respective source resistors 37, 38; first and second mirror transistors 39, 40, of PMOS type, in current mirror configuration; and first and second bias transistors 41, 42, of NMOS type.

The first and second input transistors 35, 36 receive on their gate terminals the feedback voltage $V_{FB}$ and the set voltage $V_{SET}$, respectively. The drain terminal of the first mirror transistor 39 forms the output of the operational amplifier 22 and provides the driving voltage $V_D$ under normal operating conditions.

The first bias transistor 41 has source and drain terminals connected to the first input transistor 35 and to the first mirror transistor 39, respectively. Similarly, the second bias transistor 42 has source and drain terminals connected to the second input transistor 36 and to the second mirror transistor 40, respectively. Gate terminals of the first and second bias transistors 41, 42 are both connected to the voltage source 33, for receiving the reference voltage $V_{REF}$.

The bias current source 25 includes a NMOS transistor having conduction terminals connected to the bias terminal 22a of the operational amplifier 22 and to the negative voltage supply line 26, and a gate terminal on which there is provided a constant enable signal EN. Therefore, the bias current $I_B$ drawn by the bias current source 26 is always constant.

Figure 5:
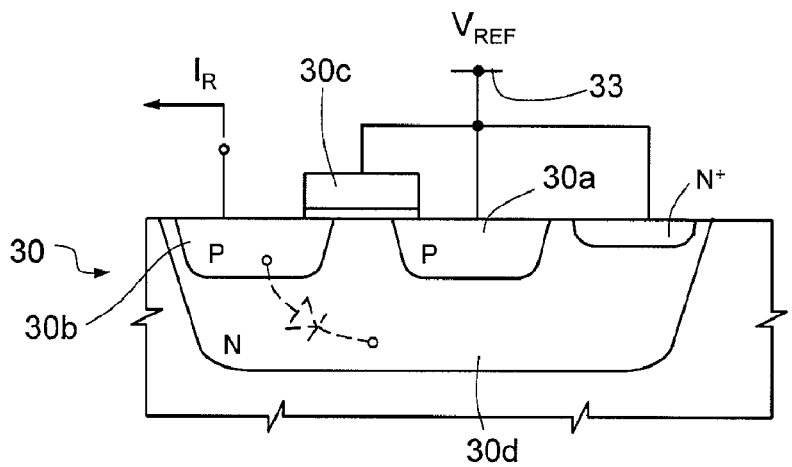
FIG. 5 is a schematic cross section through a component of the device of FIG. 2.

As to the thermal protection circuit 23, in the embodiment herein described, the junction element 30 is a PMOS transistor, having a source terminal, a gate terminal and a bulk terminal all directly connected to the voltage source 33. The junction element 30 is also shown in FIG. 5, where a source region, a drain region, a gate region and bulk N-well are designated by 30a, 30b, 30c and 30d, respectively. A reverse-biased junction is defined by the bulk N-well 30d (cathode) and the drain region 30b (anode). The thermal protection circuit 23 further comprises a first and a second amplifier transistors 44, 45, here NPN transistors, in Darlington configuration. More precisely, the first and second amplifier transistors 44, 45 have collector terminals coupled together and the emitter terminal of the first amplifier transistor 44 directly feeds into the base terminal of the second amplifier transistor 45, that in turn has its emitter terminal coupled to the bias terminal 22a of the operational amplifier 22, for supplying the shutdown current $I_{SD}$. Moreover, the collector terminals of the first and second amplifier transistors 44, 45 are connected to the voltage source 33, whereas the base terminal of the first amplifier transistor 44 is coupled to the anode terminal of the junction element 30 for receiving the reverse leakage current $I_R$ (the anode terminal is defined by the drain terminal of the PMOS transistor forming the junction element 30).

The leaking clamp circuit 31 includes a predetermined number of series-connected clamp transistors 47, here of PMOS type, each having the gate terminal connected to the respective drain terminal.

As long as the device temperature T remains within an acceptable range, the reverse leakage current $I_R$ is almost zero (normally, the reverse leakage current $I_R$ ranges from pico-amperes to at most nanoamperes). Also the shutdown current $I_{SD}$ is negligible and does not affect the bias conditions of the operational amplifier 22. However, the reverse leakage current $I_R$ and the shutdown current $I_{SD}$ exponentially grow as the device temperature T increases and the fraction ($I_B$-$I_{SD}$) of the bias current $I_B$ flowing through the operational amplifier 22 is reduced. If the device temperature T approaches a predetermined shutdown threshold $T_{SD}$ (see FIG. 3), virtually no currents flow through the operational amplifier 22, that is therefore turned off and prevented from driving the power transistor 21.

When the device 1 is operated in normal temperature conditions, the leaking clamp circuit 31 limits the gate-source $V_{GS}$ voltage of the power transistor 21 to $N*V_T$, where N is the number of the clamp transistors 4 and $V_T$ is their threshold voltage (e.g. $N*V_T$ is about 2.5 V). During thermal shutdown, the cutoff leakage current $I_{CO}$ flowing through the leaking clamp circuit 31 causes a voltage drop between the source and gate terminals of the power transistor 21 that is lower than its threshold voltage. The power transistor 21 is therefore cut off and no significant currents can flow therethrough, so that further heating is prevented.

Figure 6:
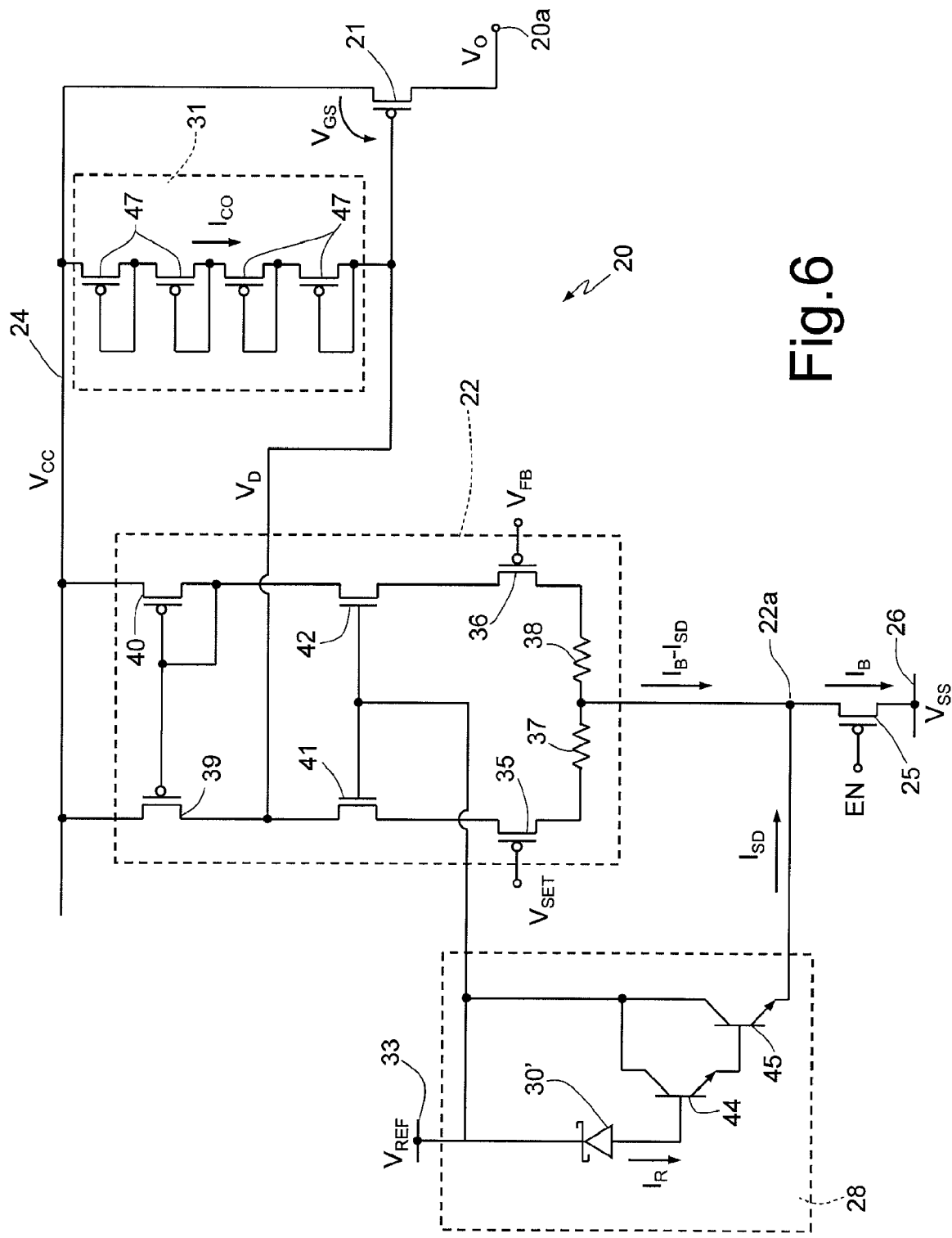
FIG. 6 is an electrical diagram of a microelectronic device according to a second embodiment of the present invention.

According to the embodiment illustrated in FIG. 6, wherein parts identical to those already shown are indicated by the same reference numbers, a reverse-biased junction element 30' includes a Schottky diode in place of a PMOS transistor. The Schottky diode has cathode and anode terminals respectively coupled to the voltage source 33 and to the base terminal of the first amplifier transistor 44. According to a variant (not shown), a PN junction diode may be used.

The above-described thermal protection circuit provides the following advantages. In the first place, only a negligible additional current is required, that does not affect the overall power consumption of the integrated device 20 in normal operation. In fact, the reverse leakage current $I_R$ is so small that even the shutdown current $I_{SD}$ only amounts to at most few nanoamperes, when the device temperature T is in the nominal range. In view of the exponential dependence on temperature, however, the reverse leakage current $I_R$ rapidly increases as the device temperature approaches T the shutdown threshold $T_{SD}$ and is sufficient to readily and reliably shut down the integrated device 20 to prevent overheating.

Moreover, the footprint of the integrated device 20 is reduced, compared to devices equipped with conventional thermal protection circuits. In fact, the described thermal protection circuit needs few components and large resistors are not required (large resistors are normally included to minimize currents involved in temperature sensing).

Another advantage resides in that shutdown is achieved through current comparison (shutdown current $I_{SD}$ compared to bias current $I_B$), rather than by means of logic signals. Thus, operation is possible both with very low supply voltages (less than 2 V) and high supply voltages (5 V or more) and there is no need for level shifting to comply with logic signal requirements.

Figure 8:
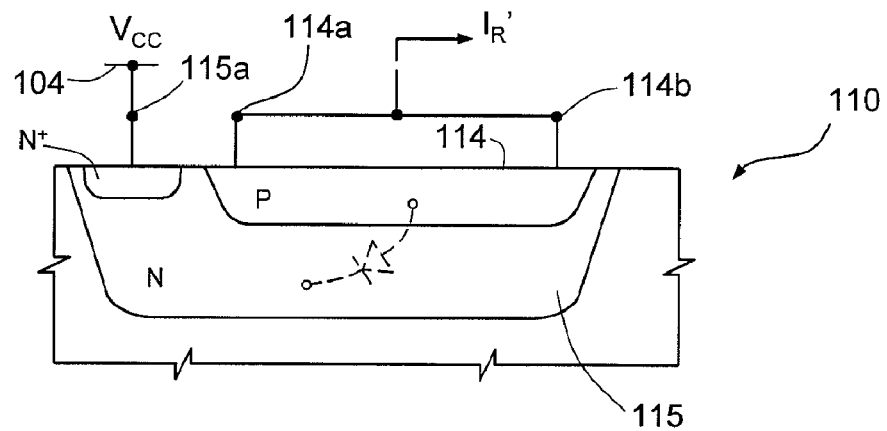
FIG. 8 is a cross section through a component of a variant of the device of FIG. 7.

Another embodiment of the invention will be now described with reference to FIGS. 7 and 8.

An integrated device 100 comprises a power transistor 101, an operational amplifier 102, for driving the power transistor 101, and a thermal protection circuit 103.

The power transistor 101 has a source terminal connected to a voltage supply line 104 and a drain terminal, that forms an output terminal 100a of the integrated device 100 and provides an output voltage $V_O$. A gate terminal of the power transistor 101 is coupled to an output of the operational amplifier 102 for receiving a driving voltage $V_D$.

Figure 7:
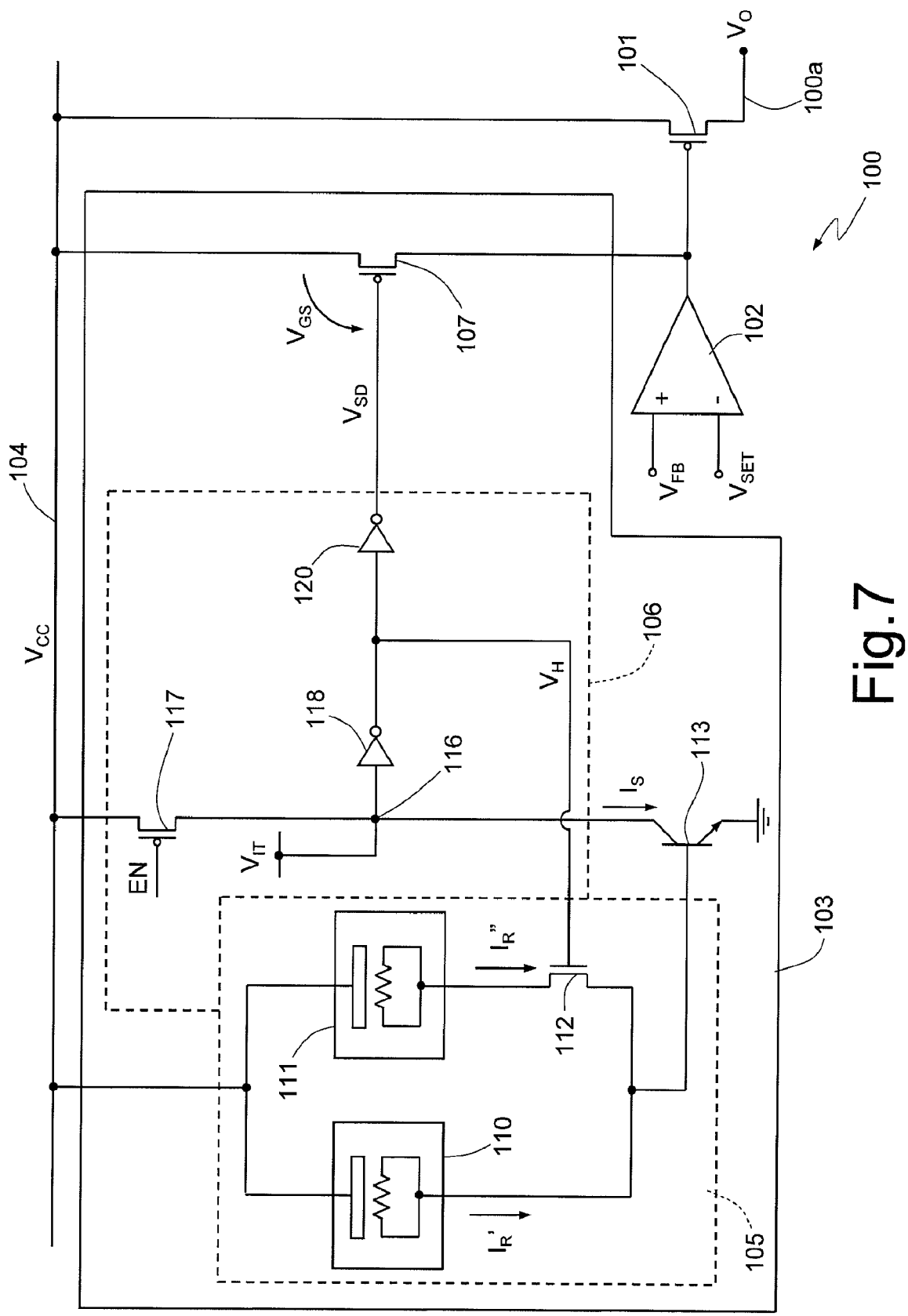
FIG. 7 is an electrical diagram of a microelectronic device according to a third embodiment of the present invention.

The operational amplifier 102 is configured for providing the driving voltage $V_D$ in a known way, based on a set voltage $V_{SET}$ and a feedback voltage $V_{FB}$ supplied on its inputs (reference and feedback circuits are conventional and not shown in FIG. 7).

The thermal protection circuit 103 comprises a temperature responsive stage 105, a driving stage 106 and a protection transistor 107.

The temperature responsive stage 105 is thermally coupled to the power transistor 101 and comprises a reverse-biased main junction element 110, a reverse-biased auxiliary junction element 111, an hysteresis transistor 112 and an amplifier transistor 113.

The main junction element 110 and the auxiliary junction element 111, that are identical to one another, include respective diffused resistors. As also shown in FIG. 8, wherein only the biased junction element 110 is illustrated, a diffused resistor includes a diffused region 114 (here of P-type) accommodated in a bulk region 115 (here of N-type) and may be used as a PN junction element by connecting together its conduction terminals 114a, 114b and applying a voltage between the conduction terminals and a bulk terminal 115a. In this configuration, in practice, the diffused region 114 and the bulk region 115 act as the anode and the cathode of a diode, respectively, and are crossed by a main reverse leakage current $I_R'$ when a reverse voltage is applied.

With reference to FIG. 7 again, both the main junction element 110 and the auxiliary junction element 111 have the respective bulk terminals (cathodes) connected to the voltage supply line 104. The conduction terminals (anode) of the main junction element 110 are directly coupled to a base terminal of the amplifier transistor 113. The conduction terminals (anode) of the auxiliary junction element 111 are connected to a drain terminal of the hysteresis transistor 112, a source terminal thereof feeds into the base terminal of the amplifier transistor 113. A gate terminal of the hysteresis transistor 112 is moreover connected to the driving stage 106 for receiving a hysteresis signal $V_H$, as explained below. In practice, the auxiliary junction element 111 is an auxiliary current source that feeds in parallel to the main reverse-biased junction element 110 and is selectively activatable by the hysteresis transistor 112 when the integrated device 1 is shut down.

The amplifier transistor 113 has an emitter terminal grounded and a collector terminal connected to a current comparison node 116, that is set at a comparison voltage $V_{JT}$.

The driving stage 106 comprises a current supply transistor 117 and first and second inverters 118, 120, connected in series.

The current supply transistor 117, here of PMOS type, receives an enable signal EN on its gate terminal from an external control line (here not shown). A source and a drain terminal of the current supply transistor 117 are respectively coupled to the voltage supply line 104 and to current comparison node 116. Hence, the current supply transistor 117 supplies a constant reference current $I_0$ to the comparison node 116.

An input of the first inverter 118 is connected to the current comparison node 116, whereas its output, further to being connected to an input of the second inverter 120, is also connected to the gate terminal of the hysteresis transistor 112.

An output of the second inverter 120 is coupled to a gate terminal of the protection transistor 107 for providing a shutdown voltage $V_{SD}$.

Moreover, the protection transistor 107 has source and drain terminals connected to the voltage supply line 104 and to the gate terminal of the power transistor 101, respectively.

In normal operation, a main reverse leakage current $I_R'$ flows through the main junction element 110 and reaches the base terminal of the amplifier transistor 113. On the contrary, virtually no currents flow through the auxiliary junction element 111, because the hysteresis transistor 112 is kept off by the hysteresis voltage $V_H$, as will be apparent from the following discussion. Also in this case, reverse leakage currents $I_R$ exponentially depend on temperature and are negligible when the integrated device 100 operates in its nominal temperature range. Also a sense current $I_S$ flowing through the amplifier transistor 113 is low and the result of current comparison with the reference current $I_0$ at the comparison node 116 forces the first inverter 118 to provide a low value of the hysteresis voltage $V_H$ (thus, the hysteresis transistor 112 is off). In view of the even number of series connected inverters, the shutdown voltage $V_{SD}$ has instead an enable value (high, near the supply voltage $V_{CC}$). Also the protection transistor 107 is therefore off and the operational amplifier 102 is enabled to properly drive the power transistor 101.

Figure 9:
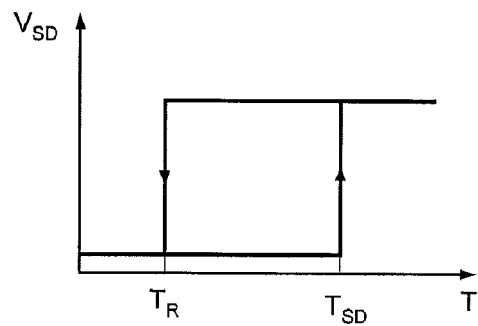
FIG. 9 is a graph showing quantities present in the device of FIG. 7.

As the device temperature T increases, the main reverse leakage current $I_R'$ of the main junction element 110 and the sense current $I_S$ exponentially grow, until the device temperature T reaches a shutdown threshold $T_{SD}$ (see also FIG. 9). Then, the first and second inverter 118, 120 switch so that the hysteresis voltage $V_H$ goes high and the shutdown voltage $V_{SD}$ is set to a shutdown value (low, ground voltage).

Both the protection transistor 107 and the hysteresis transistor 112 are thus turned on.

On the one hand, therefore, the protection transistor 107 fixes the voltage on the gate terminal of the power transistor 101 near the supply voltage $V_{CC}$. The power transistor 101 is thus turned off, the integrated device 100 is set in shutdown condition and further heating is prevented.

On the other hand, upon switching the hysteresis transistor 112 on, an auxiliary reverse leakage current $I_R''$ starts flowing through the auxiliary junction element 111 and is added to the main reverse leakage current $I_R'$. Given a same device temperature T, the sense current $I_S$ is higher than before switching to shutdown condition.

Thus, normal operation condition may be restored only when the device temperature T decreases under a restore threshold $T_R$, lower than the shutdown threshold $T_{SD}$ (FIG. 9). When the integrated device 100 is cooled under the restore threshold $T_R$, in fact, current comparison between the reference current $I_0$ and the sense current $I_S$ causes the first and second inverter 118, 120 to switch again, thereby turning the protection transistor 107 and the hysteresis transistor 112 off.

The thermal protection circuit according to the above described embodiment implements a hysteresis cycle, so as to enable cooling the integrated device well below the shutdown threshold $T_{SD}$, that triggers thermal shutdown. Therefore, frequent switching between normal operation and shutdown conditions is prevented.

Finally, it is clear that numerous modifications and variations may be made to the device and the method described and illustrated herein, all falling within the scope of the invention, as defined in the attached claims.

First, the thermal protection circuit may be coupled to any kind of electronic circuit that requires thermal protection against self-heating, and not only to voltage regulators. In particular, the invention may be advantageously exploited to protect any kind of voltage source and power amplifier.

Any kind of reverse-biased junction elements may be used. In particular, diffused resistors with conduction terminals connected together may be exploited also in the embodiments of FIGS. 1-6.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A microelectronic device comprising:
   a first circuit; and
   a second circuit, coupled to the first circuit for selectively preventing operation of the first circuit in response to a device temperature rising above a shutdown threshold, wherein the second circuit includes a temperature responsive element, thermally coupled to the first circuit for providing a shutdown signal correlated to the device temperature;
   wherein the temperature responsive element comprises a reverse-biased junction element and the shutdown signal is correlated to a reverse leakage current of the reverse-biased junction element, further comprising a hysteresis circuit configured such that, when the first circuit is prevented from operating, the hysteresis circuit causes restoring operation of the first circuit being permitted conditional to the device temperature decreasing below a restore threshold, lower than the shutdown threshold, wherein the hysteresis circuit comprises an auxiliary current source feeding in parallel to the reverse-biased junction element and selectively activatable when the first circuit is prevented from operating.

2. The device according to claim 1, wherein the reverse leakage current of the reverse-biased junction element exponentially depends on the temperature device.

3. The device according to claim 1, comprising amplifying means, coupled to the reverse-biased junction element for linearly amplifying the reverse leakage current.

4. The device according to claim 1, wherein the reverse-biased junction element comprises a PN junction element.

5. The device according to claim 4, wherein the reverse-biased junction element comprises a diffused resistor having conduction terminals connected together and a bulk terminal.

6. The device according to claim 1, wherein the reverse-biased junction element comprises a metal-semiconductor junction element.

7. The device according to claim 1, wherein the shutdown signal includes a shutdown current.

8. The device according to claim 7, wherein the first circuit comprises a driving circuit, having a bias terminal, and a bias current source, coupled to the bias terminal for supplying a bias current, and wherein the reverse-biased junction element is coupled to the bias terminal for supplying the shutdown current, such that a fraction of the bias current is prevented from flowing through the driving circuit.

9. The device according to claim 7, wherein the first circuit comprises a power component and the second circuit comprises a clamp circuit, coupled to the power component for limiting a control voltage on a control terminal of the power component, in a first operating condition, and for providing a cutoff leakage current in a second operating condition, so that the power transistor is set in an off-state.

10. The device according to claim 1, wherein the shutdown signal includes a shutdown voltage.

11. The device according to claim 10, wherein the first circuit comprises a power component and wherein the second circuit is coupled to a control terminal of the power component for selectively turning the power component off, in response to a shutdown value of the shutdown voltage.

12. The device according to claim 1, wherein the auxiliary current source comprises an additional reverse-biased junction element and a coupling element controlled for coupling the additional reverse-biased junction element in parallel to the reverse-biased junction element when the first circuit is prevented from operating.

13. A thermal protection method for a microelectronic device comprising the steps of:
   sensing a temperature of a circuit;
   providing a shutdown signal correlated to the temperature, for selectively preventing operation of the circuit in response to the temperature rising above a shutdown threshold;
   wherein the step of sensing comprises
   reverse biasing a junction element and the step of providing comprises generating the shutdown signal based on a reverse leakage current of the junction element;

restoring operation of the circuit, using a hysteresis circuit, in response to the temperature of the circuit decreasing below a restore threshold that is lower than the shutdown threshold; and at least partially turning the hysteresis circuit off when the circuit is in normal operation.

14. A microelectronic device comprising:

a first circuit; and a second circuit, including a temperature responsive element thermally coupled to the first circuit, for providing a shutdown signal to prevent operation of the first circuit in response to the temperature of the first circuit rising above a shutdown threshold, the temperature responsive element comprising a reverse-biased junction element and the shutdown signal being based on a reverse leakage current of the reverse-biased junction element, the second circuit further including a hysteresis circuit configured to restore operation of the first circuit in response to the temperature of the first circuit decreasing below a restore threshold that is lower than the shutdown threshold, the hysteresis circuit being at least partially turned off when the first circuit is in normal operation.

15. A microelectronic device as defined in claim 14, wherein the second circuit further comprises an amplifier, coupled to the reverse-biased junction element, for amplifying the reverse leakage current.

16. A microelectronic circuit as defined in claim 14, wherein the first circuit comprises a driver circuit and a bias current source to supply bias current through the driver circuit and wherein the second circuit provides the shutdown signal as a shutdown current through the bias current source of the first circuit, the shutdown current through the bias current source being sufficient to prevent operation of the driver circuit.

17. A microelectronic device comprising;

a first circuit; and a second circuit, including a temperature responsive element thermally coupled to the first circuit, for providing a shutdown signal to prevent operation of the first circuit in response to the temperature of the first circuit rising above a shutdown threshold, the temperature responsive element comprising a reverse-biased junction element and the shutdown signal being based on a reverse leakage current of the reverse-biased junction, wherein the first circuit comprises a driver circuit and a bias current source to supply bias current through the driver circuit and wherein the second circuit provides the shutdown signal as a shutdown current through the bias current source of the first circuit, the shutdown current through the bias current source being sufficient to prevent operation of the driver circuit.

18. A microelectronic device as defined in claim 17, wherein the second circuit further comprises an amplifier, coupled to the reverse-biased junction element, for amplifying the reverse leakage current.

19. A microelectronic device comprising:

a first circuit; and a second circuit, including a temperature responsive element thermally coupled to the first circuit, for providing a shutdown signal to prevent operation of the first circuit in response to the temperature of the first circuit rising above a shutdown threshold, the second circuit further including a hysteresis circuit configured to restore operation of the first circuit in response to the temperature of the first circuit decreasing below a restore threshold that is lower than the shutdown threshold, the hysteresis circuit being at least partially turned off when the first circuit is in normal operation.

\* \* \* \* \*